US009698787B1

(12) United States Patent
Agrawal et al.

(10) Patent No.: US 9,698,787 B1
(45) Date of Patent: Jul. 4, 2017

(54) INTEGRATED LOW VOLTAGE DIFFERENTIAL SIGNALING (LVDS) AND HIGH-SPEED CURRENT STEERING LOGIC (HCSL) CIRCUIT AND METHOD OF USE

(71) Applicant: Integrated Device Technology, Inc., San Jose, CA (US)

(72) Inventors: Vikas Agrawal, San Jose, CA (US); Feng Qiu, Fremont, CA (US); John C. Hsu, Sunnyvale, CA (US)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 15/083,068

(22) Filed: Mar. 28, 2016

(51) Int. Cl.
*H03K 3/00* (2006.01)
*H03K 19/0185* (2006.01)

(52) U.S. Cl.
CPC .............. *H03K 19/018514* (2013.01)

(58) Field of Classification Search
USPC ....................................................... 327/108
See application file for complete search history.

(56) References Cited

U.S. PATENT DOCUMENTS

| | | | |
|---|---|---|---|
| 4,684,941 A | 8/1987 | Smith et al. |
| 4,862,485 A | 8/1989 | Guinea et al. |
| 5,663,105 A | 9/1997 | Sua et al. |
| 5,748,949 A | 5/1998 | Johnston et al. |
| 5,757,240 A | 5/1998 | Boerstler et al. |
| 5,848,355 A | 12/1998 | Rasor et al. |
| 5,903,195 A | 5/1999 | Lukes et al. |
| 6,219,797 B1 | 4/2001 | Liu et al. |
| 6,259,327 B1 | 7/2001 | Balistreri et al. |
| 6,640,311 B1 | 10/2003 | Knowles |
| 6,643,787 B1 | 11/2003 | Zerbe et al. |
| 6,650,193 B2 | 11/2003 | Endo et al. |
| 6,683,506 B2 | 1/2004 | Ye et al. |
| 6,727,767 B2 | 4/2004 | Takada |
| 6,768,387 B1 | 7/2004 | Masuda et al. |

(Continued)

OTHER PUBLICATIONS

Texas Instruments "CDCEx913 Programmable 1-PLL VCXO Clock Synthesizer With 1.8-V, 2.5-V, and 3.3-V Outputs", Apr. 2015, pp. 1-36, pp. 11, 20-22.

(Continued)

*Primary Examiner* — Lincoln Donovan
*Assistant Examiner* — Patrick Chen
(74) *Attorney, Agent, or Firm* — Glass & Associates; Kenneth Glass; Molly Sauter

(57) ABSTRACT

An integrated circuit includes a low voltage differential signaling (LVDS) output circuit, a high-speed current steering logic (HCSL) output circuit, a bias control circuit, a programmable voltage reference circuit coupled to the bias control circuit, an output stage circuit coupled to the HCSL output circuit, a first plurality of switches to switchably couple the bias control circuit to the LVDS output circuit, a second plurality of switches to switchably couple the bias control circuit to the output stage circuit and to the HCSL output circuit and a logic control circuit coupled to the programmable voltage reference circuit, the first plurality of switches and the second plurality of switches. The logic control circuit is configured to activate either the LVDS output circuit or the HCSL output circuit.

19 Claims, 5 Drawing Sheets

(56) References Cited

U.S. PATENT DOCUMENTS

| | | | |
|---|---|---|---|
| 6,870,411 B2 | 3/2005 | Shibahara et al. |
| 6,959,066 B2 | 10/2005 | Wang et al. |
| 7,012,476 B2 | 3/2006 | Ogiso |
| 7,323,916 B1 | 1/2008 | Sidiropoulos et al. |
| 7,405,594 B1 | 7/2008 | Xu |
| 7,434,083 B1 | 10/2008 | Wilson |
| 7,541,848 B1 | 6/2009 | Masuda |
| 7,545,188 B1 | 6/2009 | Xu et al. |
| 7,573,303 B1 | 8/2009 | Chi et al. |
| 7,586,347 B1 | 9/2009 | Ren et al. |
| 7,590,163 B1 | 9/2009 | Miller et al. |
| 7,671,635 B2 | 3/2010 | Fan et al. |
| 7,737,739 B1 | 6/2010 | Bi |
| 7,741,981 B1 | 6/2010 | Wan et al. |
| 7,750,618 B1 | 7/2010 | Fang et al. |
| 7,786,763 B1 | 8/2010 | Bal et al. |
| 7,800,422 B2 | 9/2010 | Lee et al. |
| 7,816,959 B1 | 10/2010 | Isik |
| 7,907,625 B1 | 3/2011 | MacAdam |
| 7,928,880 B2 | 4/2011 | Tsukamoto |
| 7,941,723 B1 | 5/2011 | Lien et al. |
| 8,010,072 B1 | 8/2011 | Nathawad |
| 8,018,289 B1 | 9/2011 | Hu et al. |
| 8,164,367 B1 | 4/2012 | Bal et al. |
| 8,179,952 B2 | 5/2012 | Thurston et al. |
| 8,188,796 B2 | 5/2012 | Zhu et al. |
| 8,259,888 B2 | 9/2012 | Hua et al. |
| 8,284,816 B1 | 10/2012 | Clementi |
| 8,305,154 B1 | 11/2012 | Kubena et al. |
| 8,416,107 B1 | 4/2013 | Wan et al. |
| 8,432,231 B1 | 4/2013 | Nelson et al. |
| 8,436,677 B2 | 5/2013 | Kull et al. |
| 8,456,155 B2 | 6/2013 | Tamura et al. |
| 8,471,751 B2 | 6/2013 | Wang |
| 8,537,952 B1 | 9/2013 | Arora |
| 8,693,557 B1 | 4/2014 | Zhang et al. |
| 8,704,564 B2 | 4/2014 | Hasegawa et al. |
| 8,723,573 B1 | 5/2014 | Wang et al. |
| 8,791,763 B2 | 7/2014 | Taghivand |
| 8,896,476 B2 | 11/2014 | Harpe |
| 8,933,830 B1 | 1/2015 | Jeon |
| 8,981,858 B1 | 3/2015 | Grivna et al. |
| 9,077,386 B1 | 7/2015 | Holden et al. |
| 9,100,232 B1 | 8/2015 | Hormati et al. |
| 9,455,854 B2 | 9/2016 | Gao |
| 2002/0079937 A1 | 6/2002 | Xanthopoulos |
| 2002/0191727 A1 | 12/2002 | Staszewski et al. |
| 2003/0042985 A1 | 3/2003 | Shibahara et al. |
| 2003/0184350 A1 | 10/2003 | Wang et al. |
| 2004/0136440 A1 | 7/2004 | Miyata et al. |
| 2004/0165691 A1 | 8/2004 | Rana |
| 2005/0170787 A1 | 8/2005 | Yamamoto et al. |
| 2006/0103436 A1 | 5/2006 | Saitou et al. |
| 2006/0119402 A1 | 6/2006 | Thomsen et al. |
| 2006/0197614 A1 | 9/2006 | Roubadia et al. |
| 2006/0290391 A1 | 12/2006 | Leung et al. |
| 2007/0149144 A1 | 6/2007 | Beyer et al. |
| 2007/0247248 A1 | 10/2007 | Kobayashi et al. |
| 2008/0043893 A1 | 2/2008 | Nagaraj et al. |
| 2008/0104435 A1 | 5/2008 | Pernia et al. |
| 2008/0129351 A1 | 6/2008 | Chawla |
| 2008/0246546 A1 | 10/2008 | Ha et al. |
| 2009/0083567 A1 | 3/2009 | Kim et al. |
| 2009/0140896 A1 | 6/2009 | Adduci et al. |
| 2009/0153252 A1 | 6/2009 | Chen et al. |
| 2009/0184857 A1 | 7/2009 | Furuta et al. |
| 2009/0231901 A1 | 9/2009 | Kim |
| 2009/0256601 A1 | 10/2009 | Zhang et al. |
| 2009/0262567 A1 | 10/2009 | Shin et al. |
| 2010/0007427 A1 | 1/2010 | Tomita et al. |
| 2010/0052798 A1 | 3/2010 | Hirai |
| 2010/0090731 A1 | 4/2010 | Casagrande |
| 2010/0109714 A1 | 5/2010 | Lindfors et al. |
| 2010/0164761 A1 | 7/2010 | Wan et al. |
| 2010/0194483 A1 | 8/2010 | Storaska et al. |
| 2010/0240323 A1 | 9/2010 | Qiao et al. |
| 2010/0323643 A1 | 12/2010 | Ridgers |
| 2011/0006936 A1 | 1/2011 | Lin et al. |
| 2011/0032013 A1 | 2/2011 | Nelson et al. |
| 2011/0095784 A1 | 4/2011 | Behel et al. |
| 2011/0234204 A1 | 9/2011 | Tamura et al. |
| 2011/0234433 A1 | 9/2011 | Aruga et al. |
| 2011/0285575 A1 | 11/2011 | Landez et al. |
| 2011/0304490 A1 | 12/2011 | Janakiraman |
| 2012/0013406 A1 | 1/2012 | Zhu et al. |
| 2012/0161829 A1 | 6/2012 | Fernald |
| 2012/0200330 A1 | 8/2012 | Kawagoe et al. |
| 2012/0249207 A1 | 10/2012 | Natsume et al. |
| 2012/0262315 A1 | 10/2012 | Kapusta et al. |
| 2012/0293221 A1 | 11/2012 | Ma et al. |
| 2012/0297231 A1 | 11/2012 | Qawami et al. |
| 2012/0317365 A1 | 12/2012 | Elhamias |
| 2012/0328052 A1 | 12/2012 | Etemadi et al. |
| 2013/0002467 A1 | 1/2013 | Wang |
| 2013/0162454 A1 | 6/2013 | Lin |
| 2013/0194115 A1 | 8/2013 | Wu et al. |
| 2013/0211758 A1 | 8/2013 | Prathapan et al. |
| 2013/0300455 A1* | 11/2013 | Thirugnanam ........ H03K 19/018514 326/82 |
| 2014/0021990 A1 | 1/2014 | Na et al. |
| 2014/0029646 A1 | 1/2014 | Foxcroft et al. |
| 2014/0210532 A1 | 7/2014 | Jenkins |
| 2014/0327478 A1 | 11/2014 | Horng et al. |
| 2014/0347941 A1 | 11/2014 | Jose et al. |
| 2015/0028960 A1 | 1/2015 | Yorita |
| 2015/0162921 A1 | 6/2015 | Chen et al. |
| 2015/0180594 A1 | 6/2015 | Chakraborty et al. |
| 2015/0200649 A1 | 7/2015 | Trager et al. |
| 2015/0213873 A1 | 7/2015 | Ihm et al. |
| 2016/0013796 A1 | 1/2016 | Choi |
| 2016/0084895 A1 | 3/2016 | Imhof |
| 2016/0119118 A1 | 4/2016 | Shokrollahi |
| 2016/0162426 A1 | 6/2016 | Benjamin et al. |
| 2016/0211929 A1 | 7/2016 | Holden et al. |

OTHER PUBLICATIONS

"19-Output PCIE GEN 3 Buffer", Si53019-A01A, Silicon Laboratories Inc., Rev. 1.1 May 2015, 34 Pages.

"NB3W1200L: 3.3 V 100/133 MHz Differential 1:12 Push-Pull Clock ZDB/Fanout Buffer for PCIe", On Semiconductor, http://onsemi.com, Aug. 2013, Rev. 0, 26 Pages.

Avramov, et al., "1.5-GHz Voltage Controlled Oscillator with 3% Tuning Bandwidth Using a Two-Pole DSBAR Filter", Ultrasonics, Ferroelectrics and Frequency Control. IEEE Transactions on. vol. 58., May 2011, pp. 916-923.

Hwang, et al., "A Digitally Controlled Phase-Locked Loop with a Digital Ohase—Frequency Detector for Fast Acquisition", IEEE Journal of Solid State Circuits, vol. 36, No. 10, Oct. 2001, pp. 1574-1581.

Kratyuk, et al., "Frequency Detector for Fast Frequency Lock of Digital PLLs", Electronic Letters, vol. 43, No. 1, Jan. 4, 2007, pp. 1-2.

Mansuri, "Fast Frequency Acquisition Phase-Frequency Detectors for GSamples/s Phase-Locked Loops", IEEE Journal of Solid-State Circuits, vol. 37 No. 10, Oct. 2002, pp. 1331-1334.

Nagaraju, "A Low Noise 1.5GHz VCO with a 3.75% Tuning Range Using Coupled FBAR's", IEEE International Ultrasonics Symposium (IUS), Oct. 2012, pp. 1-4.

Watanabe, "An All-Digital PLL for Frequency Multilication by 4 to 1022 with Seven-Cycle Lock Time", IEEE Journal of Solid-State Circuits, vol. 39 No. 2, Feb. 2003, pp. 198-204.

* cited by examiner

US 9,698,787 B1

INTEGRATED LOW VOLTAGE DIFFERENTIAL SIGNALING (LVDS) AND HIGH-SPEED CURRENT STEERING LOGIC (HCSL) CIRCUIT AND METHOD OF USE

BACKGROUND OF THE INVENTION

The invention generally relates to electronic devices providing differential signaling outputs, and more particularly to an integrated topology for a Low Voltage Differential Signaling (LVDS) driver and High-speed current steering Logic (HCSL) driver.

Various I/O signaling methods are known in the art for use within an individual device or in a communication channel between two or more devices. Two well-known signaling methods commonly used in systems requiring high speed signaling include, Low Voltage Differential Signaling (LVDS) and High-Speed Current Steering Logic (HCSL) signaling. LVDS differential outputs are characterized by low voltage swings and low power consumption. HCSL drivers have higher voltage swings and provide faster switching speeds than LVDS drivers, but they also consume more power. In order to take advantage of both signaling technologies, LVDS and HCSL signaling methods are often incorporated onto a single integrated circuit device using dedicated LVDS driver circuits and HCSL driver circuits. Typically, the dedicated LVDS and HCSL driver circuits are connected in parallel, and a designer may choose to enable one of the drivers to implement either the LVDS driver circuitry or the HCSL driver circuitry, to meet the requirement of a particular design. However, a device employing dedicated LVDS and HCSL driver circuits requires an unnecessary duplication of circuitry, resulting in a number of disadvantages, including larger area requirements, higher cost and reduced flexibility in the design.

Accordingly, there is a need in the art for a circuit topology that utilizes common circuitry to implement two different signaling schemes on a single integrated circuit device, so as to provide flexibility in design and to reduce the size and cost of the device.

SUMMARY

The present invention describes an output structure that utilizes common circuitry to implement two differently signaling methods, LVDS and HCSL, on one integrated circuit device. This integrated topology reduces the required die area for the circuit and also reduces the use of redundant components, thereby reducing the overall cost of the device. This integrated topology also provides circuit designers with design flexibility.

In one embodiment, the present invention provides an integrated circuit comprising, a low voltage differential signaling (LVDS) output circuit, a high-speed current steering logic (HCSL) output circuit, a bias control circuit, a programmable voltage reference circuit coupled to the bias control circuit and an output stage circuit coupled to the HCSL output circuit. The integrated circuit further includes, a first plurality of switches to switchably couple the bias control circuit to the LVDS output circuit and a second plurality of switches to switchably couple the bias control circuit to the output stage circuit and the HCSL output circuit. In order to select either a LVDS output signaling mode or an HCSL output signaling mode, the integrated circuit further includes, a logic control circuit coupled to the programmable voltage reference circuit, the first plurality of switches and the second plurality of switches, the logic control circuit to activate either the LVDS output circuit or the HCSL output circuit.

In an additional embodiment, a method for selectively providing a low voltage differential signaling (LVDS) output signaling mode or a high-speed current steering logic (HCSL) output signaling mode includes, providing a voltage reference signal from a programmable voltage reference circuit to a bias control circuit based upon a desired output signaling mode, wherein the desired output signaling mode is either a low voltage differential signaling (LVDS) output signaling mode or a high-speed current steering logic (HCSL) output signaling method. The method further includes, coupling the bias control circuit to a low voltage differential signaling (LVDS) output circuit if the desired output signaling mode is an LVDS output signaling mode or coupling the bias control circuit to a high-speed current steering logic (HCSL) output circuit if the desired output signaling mode is an HCSL output signaling method and coupling the bias control to an output stage circuit coupled to the HCSL output circuit if the desired output signaling mode is an HCSL output signaling mode.

In accordance with the present invention, an integrated circuit and associated method for selectively providing a low voltage differential signaling (LVDS) output signaling mode or a high-speed current steering logic (HCSL) output signaling mode is provided, including a circuit topology that utilizes common circuitry to implement the two different signaling schemes on a single integrated circuit device, so as to provide flexibility in design and to reduce the size and cost of the device.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DETAILED DESCRIPTION

Figure 1:
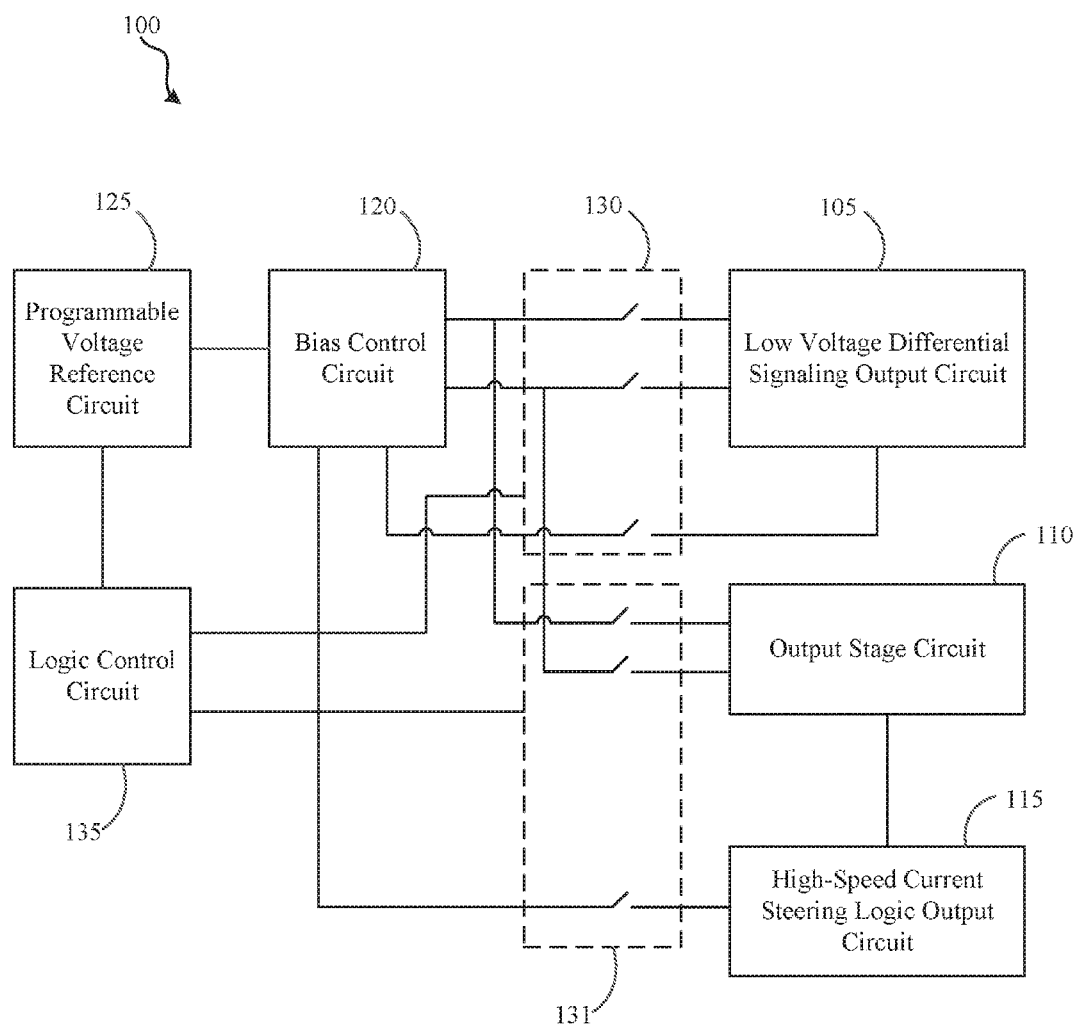
FIG. 1 is a block diagram illustrating an integrated low voltage differential signaling (LVDS) output driver and a high-speed current steering logic (HCSL) output driver, in accordance with an embodiment of the present invention.

Representative embodiments of the present invention are described below with reference to various examples wherein like reference numerals are used throughout the description and several view of the drawings to indicate like or corre- With reference to FIG. 1, an integrated circuit having an integrated low voltage differential signaling (LVDS) driver circuit and a high-speed current steering logic (HCSL) driver circuit according to an embodiment of the present invention is illustrated and generally designated 100. In at least some embodiments, the integrated circuit 100 includes a programmable voltage reference circuit 125 coupled to a bias control circuit 120, a logic control circuit 135 coupled to the programmable voltage reference circuit 125, to a first plurality of switches 130 and to a second plurality of switches 131. The bias control circuit 120 is selectively coupled, through the first plurality of switches 130 or the second plurality of switches 131, to a low voltage differential signaling (LVDS) output circuit 105, an output stage circuit 110 and a high-speed current steering logic (HCSL) output circuit 115.

In the present invention a user of the integrated circuit can choose to implement either an LVDS output signaling mode or an HCSL output signaling mode, depending upon the desired application of the integrated circuit device. Based upon the desired application, an output signal from the logic control circuit 135 is used to activate the appropriate circuitry to provide implementation of either an LVDS output signaling mode or an HCSL output signal mode. The logic control circuit 135 provides a control signal to the programmable voltage reference circuit 125, instructing the programmable voltage reference circuit 125 to provide a reference voltage to the bias control circuit 120 that is appropriate for either an LVDS output signaling mode or an HCSL output signaling mode. If an LVDS output signaling mode has been selected, the logic control circuit 135 provides a control signal to close the first plurality of switches 130, thereby coupling the bias control circuit 120 to the LVDS output circuit 105. Alternatively, if an HCSL output signaling mode has been selected, the logic control circuit 135 provides a control signal to close the second plurality of switches 131, thereby coupling the bias control circuit 120 to the output stage 110 and the HCSL output circuit 115. The logic control circuit 135 may also provide a control signal to open the second plurality of switches 131, when the first plurality of switches 130 are closed and to open the first plurality of switches 130, when the second plurality of switches 131 are closed.

In contrast with the prior art, in the present invention, the bias control circuit 120 is shared between the LVDS output circuit 105 and to the HCSL output circuit 115. When an LVDS output signaling mode is selected by the logic control circuit 135, the first plurality of switches 130 are closed and the bias control circuit 120 provides an appropriate common mode voltage input to the LVDS output circuit 105 that defines the output signal levels of the LVDS output circuit 105, based upon the reference voltage signal from the programmable voltage reference circuit 125. A feedback loop is also established between the bias control circuit 120 and the LVDS output circuit 105 when the first plurality of switches 130 are closed. Additionally, when an HCSL output signaling mode is selected by the logic control circuit 135, the second plurality of switches are closed 131 and the bias control circuit 120 provides an appropriate common mode voltage input to the output stage circuit 110 and the output stage circuit implements the output signal levels of the HCSL output circuit 115. A feedback loop is also established between the bias control circuit 120 and the HCSL output circuit 115 when the second plurality of switches 131 are closed.

Figure 2:
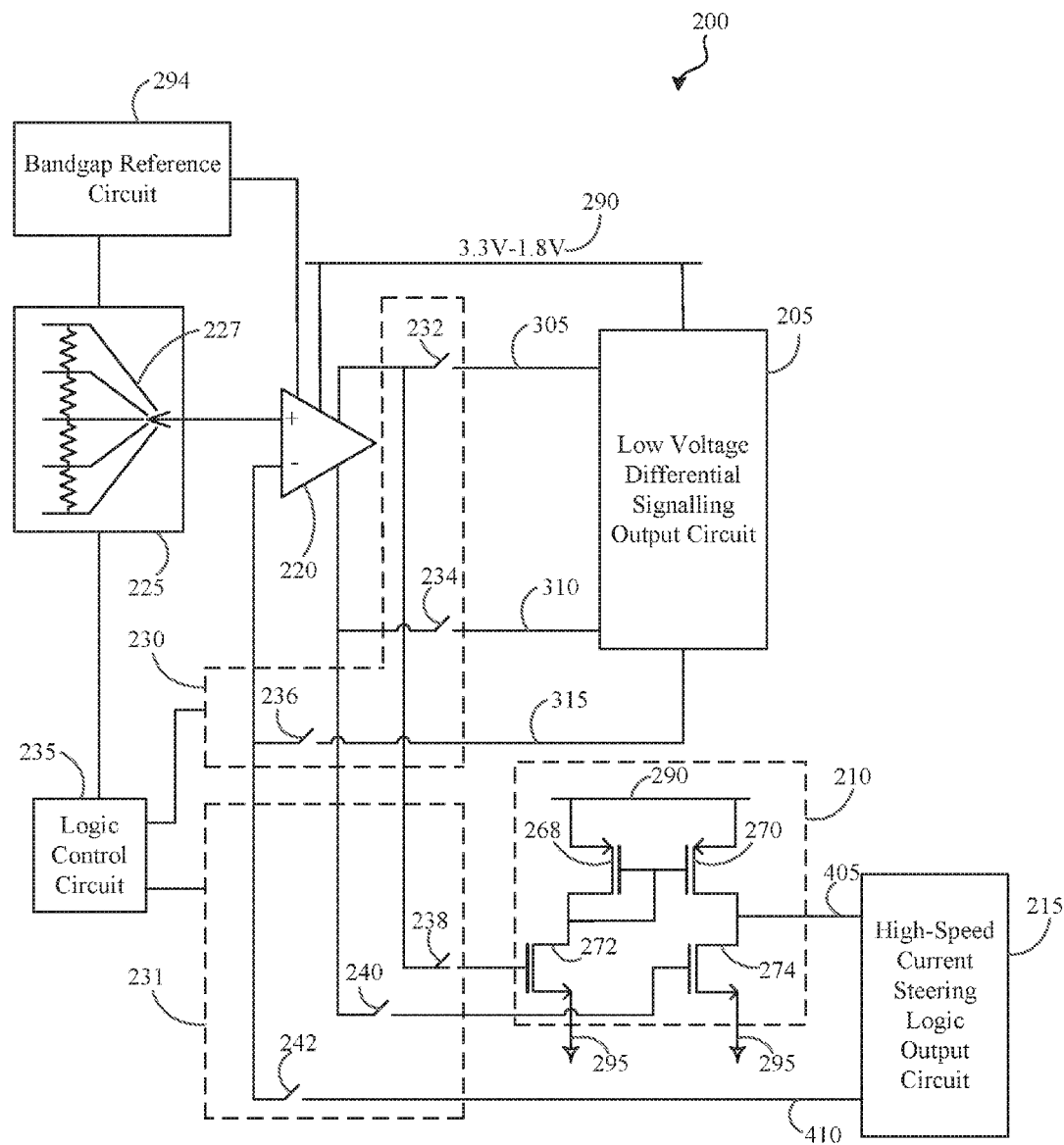
FIG. 2 is a schematic diagram illustrating an integrated low voltage differential signaling (LVDS) output driver and a high-speed current steering logic (HCSL) output driver, in accordance with an embodiment of the present invention.

With reference to FIG. 2, an embodiment of the integrated circuit comprising an integrated LVDS driver circuit and an HCSL driver circuit 200 in accordance with an embodiment of the present invention is illustrated. FIG. 2 illustrates the programmable voltage reference circuit 125 and the output stage circuit 110 of FIG. 1 in additional detail. As shown in FIG. 2, the logic control circuit 235 is coupled to the programmable voltage reference circuit 225, the first plurality of switches 230 and the second plurality of switches 231. The logic control circuit 235 provides an output signal to instruct the programmable voltage reference circuit 225, the first plurality of switches 230 and the second plurality of switches 231 to implement either an LVDS output signaling mode or an HCSL output signaling mode, depending upon a user preference. A bandgap reference circuit 294 provides a bandgap current reference signal to the programmable voltage reference circuit 225. In one embodiment, the programmable voltage reference circuit 225 includes a plurality of selectable resistance values and the output signal from the logic control circuit 235 determines which of the resistance values to select in order to provide a desired voltage reference signal from the programmable voltage reference circuit 225, given the bandgap current reference signal provided by the bandgap reference circuit 294. In a specific embodiment, if an LVDS output signaling mode with a supply voltage of 3.3V or 2.5V is selected, the voltage reference signal from the programmable voltage reference circuit 225 may be 1.2V. Alternatively, if an LVDS output signaling mode with a supply voltage of 1.8V is selected, the voltage reference signal from the programmable voltage reference circuit 225 may be 0.9V. Additionally, if an HCSL output signaling mode is selected, an appropriate voltage reference signal will be provided by the programmable voltage reference circuit 225.

After it has been determined if the integrated circuit will be operating in a LVDS output signal mode or in a HCSL output signaling mode, an appropriate voltage reference signal is provided by the programmable voltage reference circuit 225 at the positive input terminal of the bias control circuit 220. In one embodiment, the bias control circuit 220 is a common mode feedback amplifier powered by a supply voltage 290 range between 3.3V and 1.8V. The differential output of the bias control circuit 220 is provided to either the LVDS output circuit 205 or the output stage circuit 210 and the HCSL output circuit 215, depending upon which output signaling mode has been selected by the user. As such, in the present invention, the bias control circuit 220 is shared between the LVDS output circuit 205 and the HCSL output circuit 215, thereby eliminating the need for two separate bias control circuits, which reduces the required die area and cost of the integrated circuit device.

When the integrated circuit 200 is operating in an LVDS output signaling mode, logic control circuit 235 asserts a control signal instructing the programmable voltage reference circuit 225 to provide an appropriate voltage reference signal for the LVDS output signaling mode to the bias control circuit 220. The control signal also instructs the switches 232, 234, 236 of the first plurality of switches 230 to close and the switches 238, 240, 242 of the second plurality of switches 231 to open. Closing the switches 232, 234 of the first plurality of switches 230, couples the differential output signals 305, 310 of the bias control circuit 220 to the LVDS output circuit 205 and closing switch 236 of the first plurality of switches 230, establishes a feedback loop 315 between the LVDS output circuit 205 and a negative input of the bias control circuit 220.

Opening the switches 238, 240, 242 of the second plurality of switches 231, disconnects the HCSL output circuit from the bias control circuit 220. In this configuration, a desired LVDS output signaling mode is achieved from the integrated circuit device.

Alternatively, when the integrated circuit 200 is operating in an HCSL output signaling mode, logic control circuit 235 asserts a control signal instructing the programmable voltage reference circuit 225 to provide an appropriate voltage reference signal for the HCSL output signaling mode to the bias control circuit 220. The control signal also instructs the switches 238, 240, 242 of the second plurality of switches 231 to close and switches 232, 234, 236 of the first plurality of switches 230 to open. Closing the switches 238, 240 of the second plurality of switches 231, couples the differential output signal of the bias control circuit 220 to the output stage circuit 210 and closing switch 242 of the second plurality of switches 231, establishes a feedback loop between the HCSL output circuit 215 and a negative input of the bias control circuit 220. The output stage circuit 210 adjusts the differential output signals from the bias control circuit 220 and provides the adjust signals to the HCSL output circuit 215 to define the output signal levels for the selected HCSL output signaling mode. In one embodiment, the HCSL output circuit 215 comprises a differential pair amplifier with current mirroring to define the output signaling level for the HCSL output circuit 215. In a specific embodiment, the output stage circuit 210 comprises a first p-channel metal oxide semiconductor (PMOS) transistor 268 and a second PMOS device 270 have a common gate node coupled to a drain of the first PMOS device 268. The source nodes of the first PMOS device 268 and the second PMOS device 270 are coupled to a supply voltage 290. The output stage circuit 210 further includes a first n-channel metal oxide semiconductor (NMOS) transistor 272 having a drain connected to the gates of the first PMOS device 268 and the second PMOS device 270, a gate coupled to a first output of the bias control circuit 220 and a source coupled to a ground node 295. The output stage circuit 210 further includes a second NMOS device 274 having a drain coupled to the drain of the second PMOS device 270, a gate coupled to a second output of the bias control circuit 220 and a source coupled to a ground node 295. The output signal from the output stage circuit 210 is provided to the HCSL output circuit 215 at the common drain node of the second PMOS device 270 and the second NMOS device 274. Opening the switches 232, 234, 236 of the first plurality of switches 230, disconnects the LVDS output circuit from the bias control circuit 220. In this configuration, a desired HCSL output signaling mode is achieved from the integrated circuit device.

Figure 3:
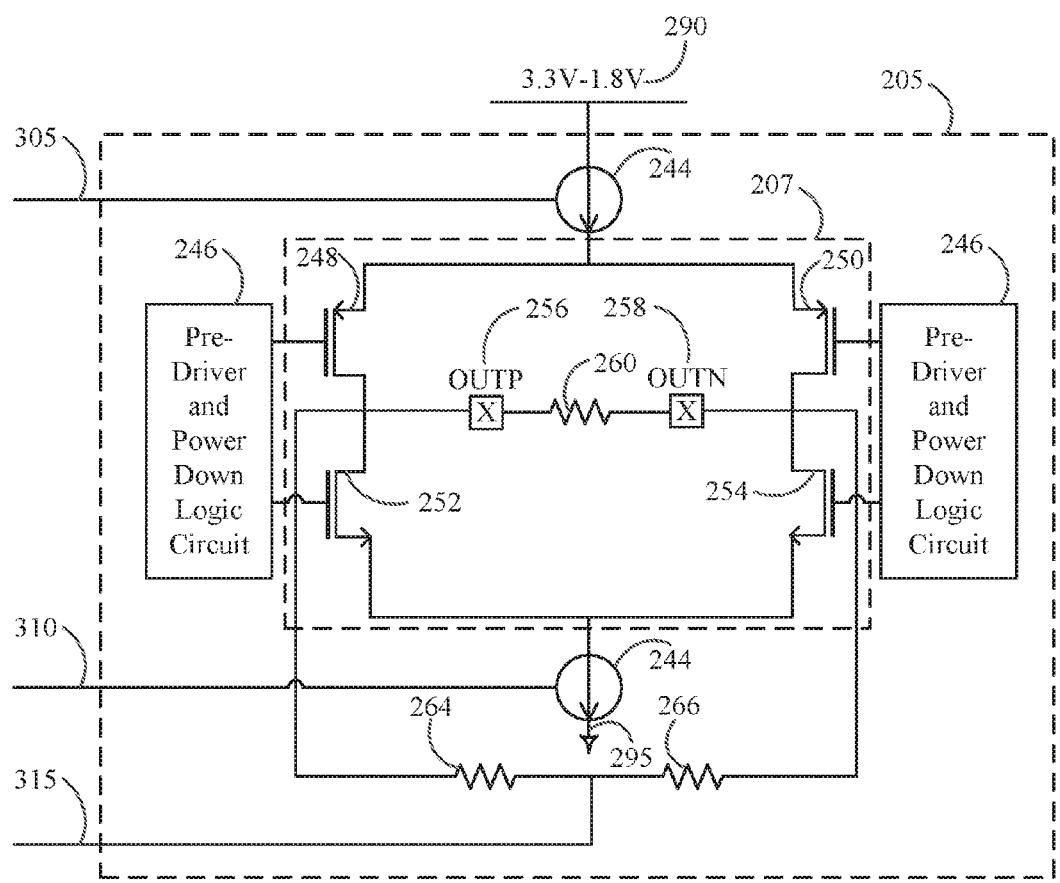
FIG. 3 is a detailed schematic illustrating an exemplary low voltage differential signaling (LVDS) output circuit, in accordance with an embodiment of the present invention.

Low voltage differential signaling (LVDS) circuits are well known in the art and various configurations for LVDS circuits are considered within the scope of the present invention. FIG. 3 illustrates one embodiment of an LVDS output circuit 205 in accordance with the present invention. As previously described with reference to FIG. 2, when an LVDS output signaling mode is desired, the switches 232, 234, 236 of the first plurality of switches 230 are closed, thereby providing a first output signal 305 and a second output signal 310 from the bias control circuit 220 to the LVDS output circuit 205. Closing the first plurality of switches 230 also establishes a feedback loop 315 between the negative input terminal of the bias control circuit 220 and the LVDS output circuit 205.

As shown with reference to FIG. 3, the LVDS output circuit 205 includes a first pre-driver and power down logic circuit 246 coupled to a current mode logic stage 207 comprising a plurality of transistors 248, 250, 252, 254 in an H-configuration to provide a differential output signal as a true output 256 and a compliment output 258. In one embodiment, the current mode logic stage 207 further comprises a first differential pair of metal oxide semiconductor (MOS) devices 248, 252 coupled to the true output signal and a second differential pair of metal oxide semiconductor (MOS) devices 250, 254 coupled to the compliment output signal. The first pre-driver and power down logic circuit 246 insures an appropriate amplitude of the input signals to the LVDS output circuit 210 and controls the powering down of the LVDS output circuit 205 when the first plurality of switches are opened, thereby disconnecting the LVDS output circuit from the bias control circuit 220. In order to drive the differential output signal across the termination resistor 260, a current source 244 is established between a supply voltage 290 and a ground node 295. The current source 244 is controlled by the first output signal 305 and the second output signal 310 from the bias control circuit 220. In a particular embodiment, the current mode logic stage 207 of the LVDS output circuit 205 includes a first PMOS device 248 and a first NMOS device 252 having a source coupled to the current source 244, a gate coupled to the pre-driver and power down logic circuit 246 and a drain coupled to the true output 256 of the LVDS output circuit 205. The current mode logic stage 207 further includes a second PMOS device 250 and a second NMOS device 254 having a source coupled to the current source 244, a gate coupled to the pre-driver and power down logic circuit 246 and a common drain node coupled to the compliment output 258 of the LVDS output circuit 205. The LVDS output circuit may further include a pair of resistors 264, 266 in the feedback loop between the LVDS output circuit 205 and the bias control circuit 220.

Figure 4:
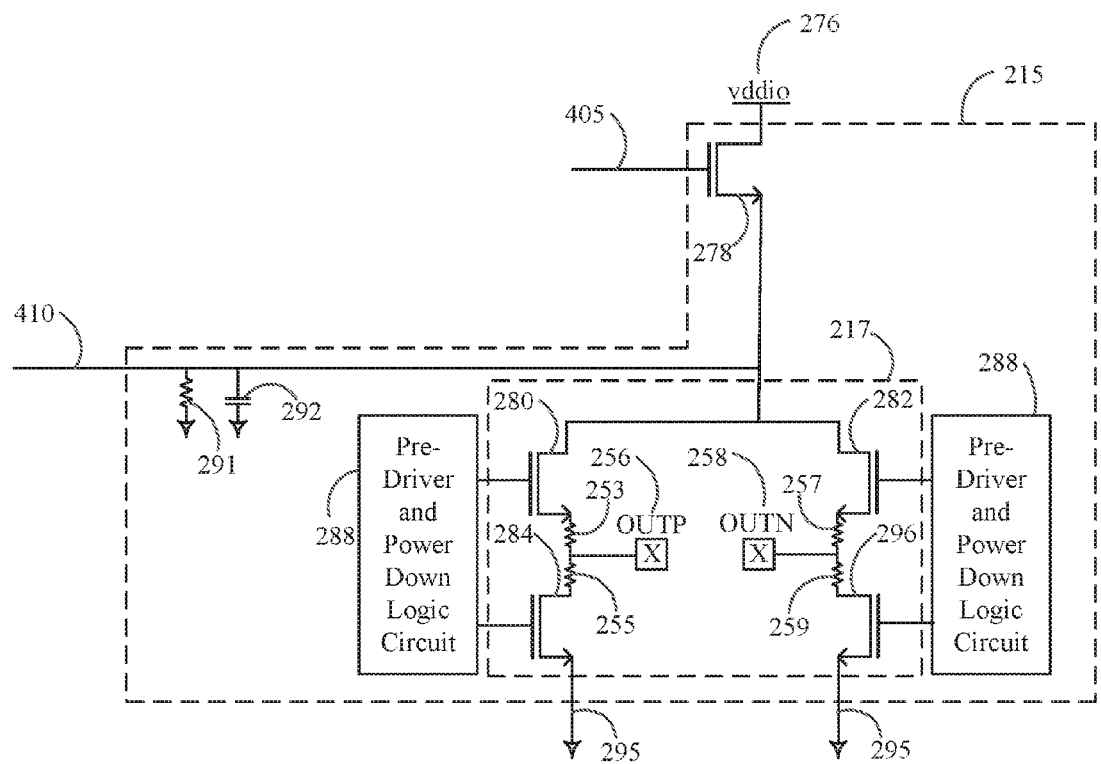
FIG. 4 is a flow diagram illustrating an exemplary high-speed current steering logic (HCSL) output circuit, in accordance with an embodiment of the present invention.

High-speed current steering logic (HCSL) circuits are well known in the art and various configurations for HCSL circuits are considered within the scope of the present invention. FIG. 4 illustrates one embodiment of an HCSL output circuit 215 in accordance with the present invention. As previously described, when an HCSL output signaling mode is desired, the switches of the second plurality of switches are closed, thereby providing a first output signal 405 and a second output signal 410 from the bias control circuit 220 to the output stage circuit 210, which provides an output signal 405 to the HCSL output circuit 215. Closing the second plurality of switches also establishes a feedback loop 410 between the negative input terminal of the bias control circuit 220 and the HCSL output circuit 215.

As shown with reference to FIG. 4, the HCSL output circuit 215 includes a second pre-driver and power down logic circuit 288 coupled to a push-pull voltage logic stage 217, the push-pull voltage logic stage 217 to provide a differential output signal. In this embodiment, the push-pull voltage logic stage 217 comprises a first pair of n-channel metal oxide semiconductor (NMOS) devices 280, 284 coupled to the true output of the second pre-driver and power down logic circuit 288 for output of a true output signal. A second pair of n-channel metal oxide semiconductor (NMOS) devices 282, 296 are coupled to the compliment output of the second pre-driver and power down logic circuit 288 for output of a compliment output signal. In a specific embodiment, the HCSL output circuit 215 comprises a first NMOS device 278 having a gate coupled to the output stage circuit 210, a drain coupled to a differential output power supply 276 and a source coupled to the push-pull voltage logic stage 217 of the HCSL output circuit 215. The push-pull voltage logic stage 217 comprises a second NMOS device 280 and a third NMOS device 282 having a common drain node coupled to the source of the first NMOS device 278 and a gate coupled to the second pre-driver and power down logic circuit 288. The source of the second NMOS device 280 is coupled to the true output 256 through a first resistor 253. The source of the third NMOS device 282 is coupled to the compliment output 258 through a second resistor 257. The push-pull voltage logic stage 217 further includes a fourth NMOS device 284 and a fifth NMOS device 296 having a gate coupled to the second pre-driver and power down logic circuit 288 and a source coupled to a ground node 295. The drain of the fourth NMOS device 284 is coupled to the true output 256 through a third resistor 255 and the drain of the fifth NMOS device 296 is coupled to the compliment output 258 through a fourth resistor 259. The HCSL output circuit further includes a resistor 291 and a capacitor 292 coupled to a ground node and the feedback loop 410.

Figure 5:
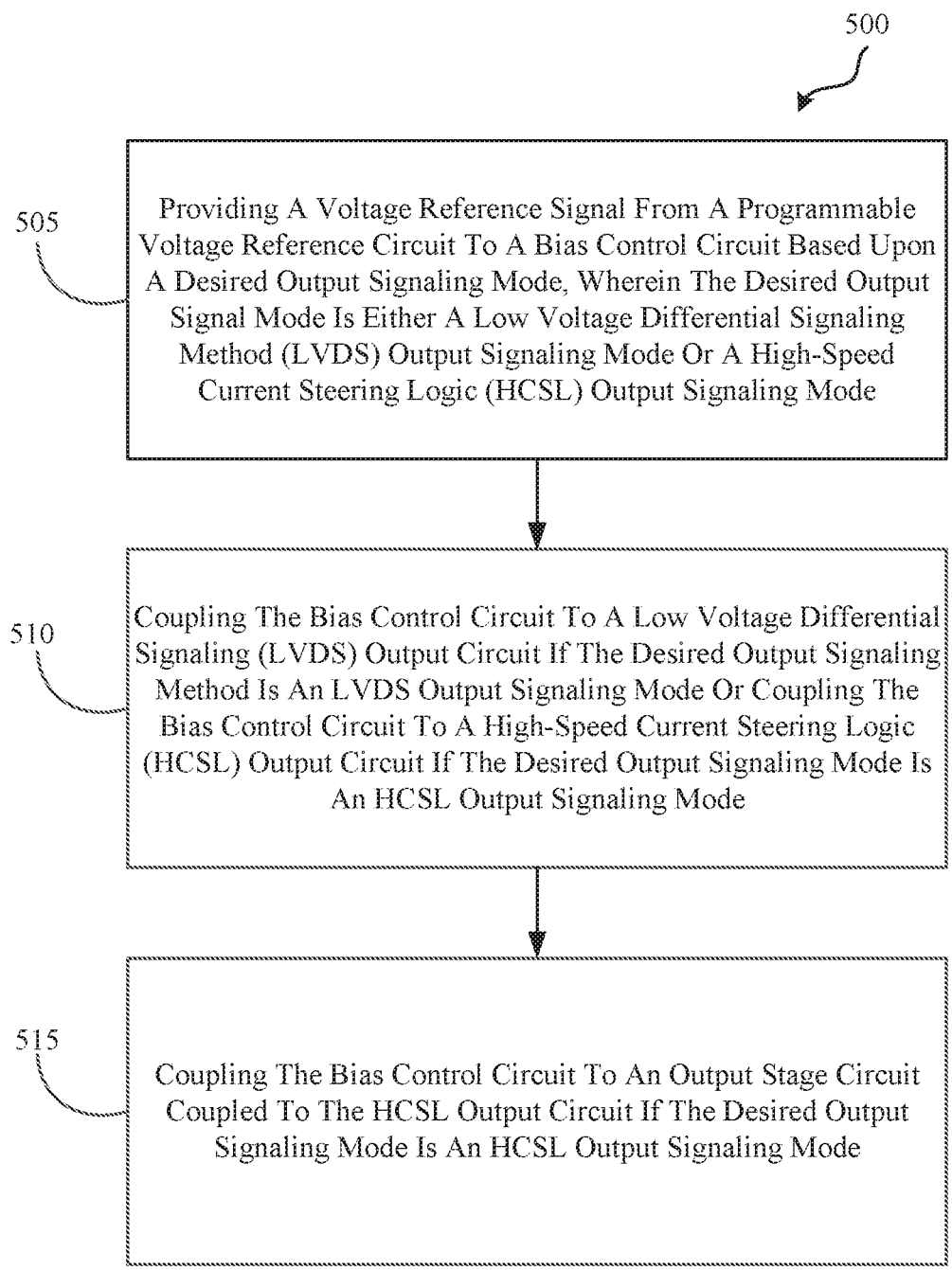
FIG. 5 is a flow diagram illustrating a method for selectively providing a low voltage differential signaling (LVDS) output signaling mode or a high-speed current steering logic (HCSL) output signaling mode, in accordance with an embodiment of the present invention.

With reference to FIG. 5, in accordance with the present invention, a method for selectively providing a low voltage differential signaling (LVDS) output signaling mode or a high-speed current steering logic (HCSL) output signaling mode is provided 500. In one embodiment, the method includes, providing a voltage reference signal from a programmable voltage reference circuit to a bias control circuit based upon a desired output signaling mode, wherein the desired output signaling mode is either a low voltage differential signaling (LVDS) output signaling mode or a high-speed current steering logic (HCSL) output signaling mode 505. With reference to FIG. 2, in a particular embodiment, the programmable voltage reference circuit 125 may provide the voltage reference signal to the bias control circuit 220 based upon a user selecting to implement either an LVDS output signaling mode or an HCSL output signaling mode of the integrated circuit 100. The logic control circuit 135 can be used to assert the desired output signaling mode to the programmable voltage control circuit 125.

After the voltage reference signal has been provided to the bias control circuit, the method continues by coupling the bias control circuit to a low voltage differential signaling (LVDS) output circuit if the desired output signaling mode is an LVDS output signaling mode or coupling the bias control circuit to a high-speed current steering logic (HCSL) output circuit if the desired output signaling mode is an HCSL output signaling mode 510. With reference to FIG. 2, in a particular embodiment, the bias control circuit 220 may be coupled to the LVDS output circuit 105 using the first plurality of switches 130 to define the output signal levels for the LVDS output circuit 105 and to establish a feedback loop between the LVDS output circuit 105 and bias control circuit 120. Alternatively, the bias control circuit 220 may be coupled to the HCSL output circuit 115 utilizing the second plurality of switches 131 to established a feedback loop between the HCSL output circuit 115 and the bias control circuit 120. The logic control circuit 135 can be used to activate the first plurality of switches 130 and the second plurality of switches 131.

After the bias circuit has been coupled to either the LVDS output circuit or to establish the feedback loop with the HCSL output circuit, the method continues by coupling the bias control circuit to an output stage circuit coupled to the HCSL output circuit if the desired output signaling mode is an HCSL output signaling mode 515. With reference to FIG. 2, the second plurality of switches 131 can be utilized to couple the bias control circuit 120 to the output stage circuit 110, which defines the output signal levels for the HCSL output circuit 115. The logic control circuit 135 can be used to activate the second plurality of switches 131.

In accordance with the present invention, an integrated circuit and associated method for selectively providing a low voltage differential signaling (LVDS) output signaling mode or a high-speed current steering logic (HCSL) output signaling mode is provided, including a circuit topology that utilizes common circuitry to implement the two different signaling schemes on a single integrated circuit device, so as to provide flexibility in design and to reduce the size and cost of the device Exemplary embodiments of the invention have been described using CMOS technology. As would be appreciated by a person of ordinary skill in the art, a particular transistor can be replaced by various kinds of transistors with appropriate inversions of signals, orientations and/or voltages, as is necessary for the particular technology, without departing from the scope of the present invention.

In one embodiment, the LVDS driver circuit and the HCSL driver circuit may be implemented in an integrated circuit as a single semiconductor die. Alternatively, the integrated circuit may include multiple semiconductor dies that are electrically coupled together such as, for example, a multi-chip module that is packaged in a single integrated circuit package.

In various embodiments, the system of the present invention may be implemented in a Field Programmable Gate Array (FPGA) or Application Specific Integrated Circuit (ASIC). As would be appreciated by one skilled in the art, various functions of circuit elements may also be implemented as processing steps in a software program. Such software may be employed in, for example, a digital signal processor, microcontroller or general-purpose computer.

For purposes of this description, it is understood that all circuit elements are powered from a voltage power domain and ground unless illustrated otherwise. Accordingly, all digital signals generally have voltages that range from approximately ground potential to that of the power domain.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. An integrated circuit comprising:
  a low voltage differential signaling (LVDS) output circuit;
  a high-speed current steering logic (HCSL) output circuit;
  a bias control circuit;
  a programmable voltage reference circuit coupled to the bias control circuit;
  an output stage circuit coupled to the HCSL output circuit;
  a first plurality of switches to switchably couple the bias control circuit to the LVDS output circuit; and
  a second plurality of switches to switchably couple the bias control circuit to the output stage circuit and to the HCSL output circuit.

2. The integrated circuit of claim 1, further comprising a logic control circuit coupled to the programmable voltage reference circuit, the first plurality of switches and the second plurality of switches, the logic control circuit to activate either the LVDS output circuit or the HCSL output circuit.

3. The integrated circuit of claim 2 wherein the HCSL output circuit further comprises:
  a second pre-driver and power down logic circuit;

a push-pull voltage logic stage coupled to the second pre-driver and power down logic circuit, the push-pull voltage logic stage to provide a differential output signal; and a first n-channel metal oxide semiconductor (NMOS) device having a gate coupled to the output stage circuit, a drain coupled to a differential output power supply and a source coupled to the push-pull voltage logic stage.

4. The integrated circuit of claim 3, wherein the second pre-driver and power down logic circuit provides a true output signal and a complimentary output signal and wherein the push-pull voltage logic stage further comprises a first pair of n-channel metal oxide semiconductor (NMOS) devices coupled to the true output signal and a second pair of n-channel metal oxide semiconductor (NMOS) devices coupled to the compliment output signal.

5. The integrated circuit of claim 1, wherein the LVDS output circuit further comprises;
 a first pre-driver and power down logic circuit;
 a current mode logic stage coupled to the first pre-driver and power down logic circuit, the current mode logic stage to provide a differential output signal;
 a termination resistor coupled across the differential output signal of the current mode logic stage; and
 a current source coupled across the current mode logic stage to drive the differential output signal across the termination resistor.

6. The integrated circuit of claim 5, wherein the first pre-driver and power down logic circuit provides a true output signal and a compliment output signal and wherein the current mode logic stage further comprises a first differential pair of metal oxide semiconductor (MOS) devices coupled to the true output signal and a second differential pair of metal oxide semiconductor (MOS) devices coupled to the compliment output signal.

7. The integrated circuit of claim 1, wherein the bias control circuit further comprises a common mode feedback amplifier circuit to define an output signaling level for the LVDS output circuit.

8. The integrated circuit of claim 1, further comprising a bandgap reference circuit coupled to the bias control circuit and the programmable voltage reference circuit.

9. The integrated circuit of claim 8, wherein the programmable voltage reference circuit further comprises a plurality of selectable resistive devices to provide a voltage reference signal to the bias control circuit based upon an input from the bandgap reference circuit and an input from a logic control circuit.

10. The integrated circuit of claim 9, wherein the input from the logic control circuit instructs the programmable voltage reference circuit to generate an appropriate voltage reference signal for an LVDS output signaling mode or for an HCSL output signaling mode.

11. The integrated circuit of claim 1, wherein the output stage circuit further comprises, a differential pair amplifier with current mirroring to define an output signaling level for the HCSL output circuit.

12. An integrated circuit comprising:
 a low voltage differential signaling (LVDS) output circuit;
 a high-speed current steering logic (HCSL) output circuit;
 a bias control circuit;
 a programmable voltage reference circuit coupled to the bias control circuit;
 an output stage circuit coupled to the HCSL output circuit;
 a first plurality of switches to switchably couple the bias control circuit to the LVDS output circuit;

a second plurality of switches to switchably couple the bias control circuit to the output stage circuit and to the HCSL output circuit; and a logic control circuit coupled to the programmable voltage reference circuit, the first plurality of switches and the second plurality of switches, the logic control circuit to activate either the LVDS output circuit or the HCSL output circuit.

13. A method comprising:
 providing a voltage reference signal from a programmable voltage reference circuit to a bias control circuit based upon a desired output signaling mode by providing a bandgap current reference signal from a bandgap reference circuit to the programmable voltage reference circuit and providing a control signal from a logic control circuit to the programmable voltage reference circuit, wherein the control signal is based upon the desired output signaling mode and wherein the desired output signaling mode is either a low voltage differential signaling (LVDS) output signaling mode or a high-speed current steering logic (HCSL) output signaling mode;
 coupling the bias control circuit to a LVDS output circuit if the desired output signaling mode is an LVDS output signaling mode or coupling the bias control circuit to a HCSL output circuit if the desired output signaling mode is an HCSL output signaling mode; and
 coupling the bias control circuit to an output stage circuit coupled to the HCSL output circuit if the desired output signaling mode is an HCSL output signaling mode.

14. The method of claim 13, wherein coupling the bias control circuit to a LVDS output circuit if the desired output signaling mode is an LVDS output signaling mode further comprises, providing a common mode voltage to the LVDS output circuit to define an output signaling level for the LVDS output circuit based upon the desired LVDS output signaling mode.

15. The method of claim 13, wherein coupling the bias control circuit to a LVDS output circuit if the desired output signaling mode is an LVDS output signaling mode further comprises, providing a common mode feedback path between the bias control circuit and the LVDS output circuit.

16. A method comprising:
 providing a voltage reference signal from a programmable voltage reference circuit to a bias control circuit based upon a desired output signaling mode, wherein the desired output signaling mode is either a low voltage differential signaling (LVDS) output signaling mode or a high-speed current steering logic (HCSL) output signaling mode;
 coupling the bias control circuit to a LVDS output circuit if the desired output signaling mode is an LVDS output signaling mode or coupling the bias control circuit to a HCSL output circuit by providing a common mode feedback path between the bias control circuit and the HCSL output circuit if the desired output signaling mode is an HCSL output signaling mode; and
 coupling the bias control circuit to an output stage circuit coupled to the HCSL output circuit if the desired output signaling mode is an HCSL output signaling mode.

17. The method of claim 16, wherein coupling the bias control to an output stage circuit coupled to the HCSL output circuit if the desired output signaling mode is an HCSL output signaling mode further comprises, providing a common mode voltage from the output stage circuit to the HCSL output circuit to define an output signaling level for the HCSL output circuit based upon the desired HCSL output signaling mode.

18. The method of claim 16, wherein coupling the bias control circuit to a LVDS output circuit if the desired output signaling mode is an LVDS output signaling mode further comprises, closing a first plurality of switches, between the bias control circuit and the LVDS output circuit.

19. The method of claim 18, wherein coupling the bias control circuit to a HCSL output circuit if the desired output signaling mode is an HCSL output signaling mode and coupling the bias control to an output stage circuit coupled to the HCSL output circuit if the desired output signaling mode is an HCSL output signaling mode further comprises, closing a second plurality of switches between the bias control circuit and the HCSL output circuit, and between the bias control circuit and the output stage circuit.

\* \* \* \* \*